(12) United States Patent
Wu et al.

(10) Patent No.: US 8,565,009 B2
(45) Date of Patent: Oct. 22, 2013

(54) ACCESS TO MULTI-PORT DEVICES (75) Inventors: Ching-Wei Wu, Caotun Town (TW);
Lee Cheng Hung, Hsinchu (TW);
Hung-Je Liao, Hsinchu (TW); Jui-Che Tsai, Tainan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 320 days.

(21) Appl. No.: 12/767,935

(22) Filed: Apr. 27, 2010

(65) Prior Publication Data
US 2010/0271898 A1 Oct. 28, 2010

Related U.S. Application Data (60) Provisional application No. 61/173,420, filed on Apr. 28, 2009.

(51) Int. Cl.
*G11C 11/00* (2006.01)
(52) U.S. Cl.
USPC .................. 365/154; 365/189.15; 365/230.05
(58) Field of Classification Search
USPC ................................ 365/154, 189.15, 230.05
See application file for complete search history.

(56) References Cited

U.S. PATENT DOCUMENTS

| | | | |
|---|---|---|---|
| 7,869,302 B2 * | 1/2011 | Joshi et al. ............... | 365/230.06 |
| 2003/0210566 A1 * | 11/2003 | Yamagami .................... | 365/154 |
| 2008/0291769 A1 * | 11/2008 | Nii .......................... | 365/230.05 |
| 2008/0316851 A1 * | 12/2008 | Kinoshita et al. ........ | 365/230.05 |
| 2011/0188327 A1 * | 8/2011 | Ishikura et al. .......... | 365/189.15 |

OTHER PUBLICATIONS

Kang et al CMOS Digital Integrated Circuits Analysis and Design, 3rd edition, 106, 171-183, 438-441, 443-445.*
Nii, K., et al., "A 65 nm Ultra-High-Density Dual-port SRAM with 0.71um2 8T-cell for SoC", 2006 Symposium on VLSI Circuits Digest of Technical Papers.
Ishikura, S., "A 45nm 2port 8T-SRAM using hierarchical replica bitline technique with immunity from simultaneous R/W acess issues", 2007 Symposium on VLSI Circuits Digest of Technical Papers; pp. 254-255.

* cited by examiner

*Primary Examiner* — Vu Le
*Assistant Examiner* — Han Yang
(74) *Attorney, Agent, or Firm* — Lowe Hauptman & Ham, LLP (57) ABSTRACT

Mechanisms for improving static noise margin and/or reducing misread current in multi-port devices are disclosed. In some embodiments related to dual port SRAM a suppress device (e.g., transistor) is provided at each word line port. When both ports are activated, both suppress devices are on and lower the voltage level of these ports, which in turn lower the voltage level at the node storing the data for the memory. As the voltage level at the data node is lowered, noise margin is improved and read disturb can be avoided.

20 Claims, 8 Drawing Sheets

ACCESS TO MULTI-PORT DEVICES

CROSS-REFERENCE TO RELATED APPLICATIONS

The present application claims priority of U.S. Provisional Patent Application Ser. No. 61/173,420, filed on Apr. 28, 2009, which is incorporated herein by reference in its entirety.

TECHNICAL FIELD

The present disclosure is related to multi-port devices. Various embodiments provide mechanisms to automatically improve static noise margin or reduce misread current in simultaneous access to multi-port memories.

BACKGROUND

In Dual Port Static Random Access Memory (DPSRAM) the static noise margin (SNM) changes between two different access modes, is degraded and generally at the worst case in common access mode. In two-port register files (2PRF) or multi-port register files, when simultaneous read/write access occurs at the same row, misreading can occur due to large current leakage. Prior art approaches that solve the above deficiencies require complex timing, circuit designs and/or area compromise (e.g. areas to implement such complex circuits, to provide circuits for speed and/or margin trade-off, etc.).

SUMMARY

Various embodiments of the disclosure improve SNM and/or reduce misread current in multi-port devices. In an embodiment related to DPSRAM (dual port SRAM) a suppress device (e.g., a transistor) is provided at each word line port. When both ports are activated, both suppress devices are on and lower the voltage level of these ports, which in turn lower the voltage level at the node storing the data for the memory. As the voltage level at the data node is lowered, noise margin is improved and read disturb can be avoided. Embodiments related to two-port register files 2PRF and other embodiments are also disclosed.

Embodiments of the disclosure can have one or a combination of the following features and/or advantages. Embodiments improve the noise margin and thus can prevent misreads. Embodiments automatically detect the worst case conditions and provide voltage level compensation. Embodiments are easy to implement without area penalty in both DPSRAMs and 2PRFs. DPSRAMs using embodiments of the disclosure can be designed in a smaller area by using smaller beta ratio. In 2PRF applications, embodiments automatically detect the read/write access condition and improve the situations without impact to the read cycle access time.

BRIEF DESCRIPTION OF THE DRAWINGS

The details of one or more embodiments of the disclosure are set forth in the accompanying drawings and the description below. Other features and advantages of the disclosure will be apparent from the description, drawings, and claims.

Like reference symbols in the various drawings indicate like elements.

DETAILED DESCRIPTION

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one skilled in the art to which the disclosure relates. Reference numbers may be repeated throughout the embodiments, but this does not necessarily require that feature(s) of one embodiment apply to another embodiment, even if they share the same reference number.

DPSRAM Embodiment

Figure 1:
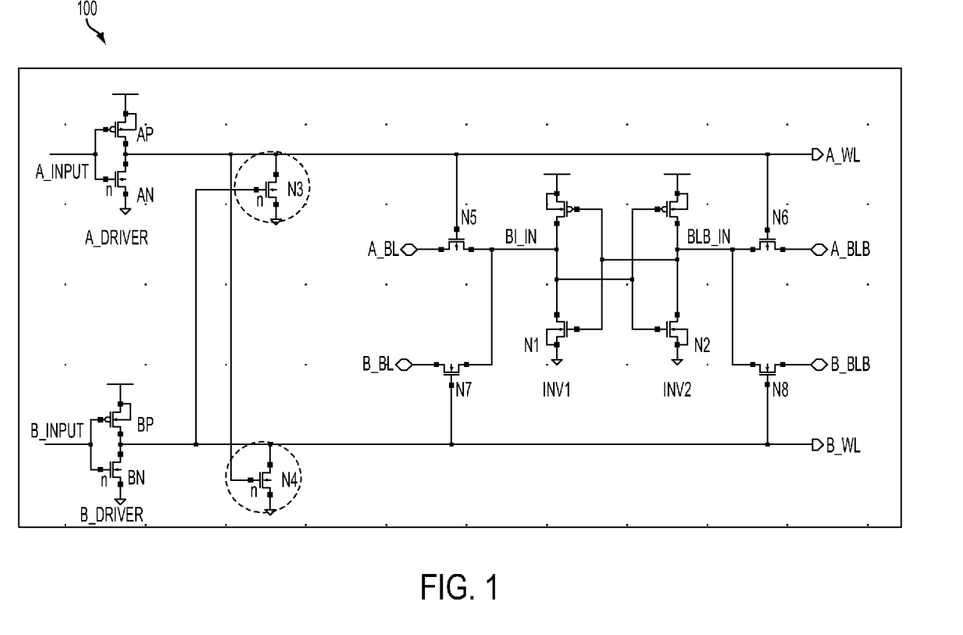
FIG. 1 shows an exemplary DPSRAM utilizing embodiments of the disclosure.

FIG. 1 shows an exemplary DPSRAM 100 illustrating an embodiment of the disclosure. Signals A_INPUT and B_INPUT control A-port word line driver A_DRIVER and B-port word line driver B_DRIVER, which in turns control A-port word line A_WL and B-port word line B_WL respectively. When signal A_INPUT is activated (e.g., low) it turns off transistor AN and turns on transistor AP, and, as a result, turns on (or activate) A_DRIVER by allowing the current flowing from Vdd through transistor AP to port A_WL. When signal A_INPUT is de-activated (e.g., high) it turns off transistor AP and turns on transistor AN, and as a result, turns off A_DRIVER by allowing current flowing from port A_WL through transistor AN to ground. When signal B_INPUT is activated (e.g., low) it turns off transistor BN and turns on transistor BP, and, as a result, turns on (or activate) B_DRIVER by allowing current flowing from Vdd through transistor BP to port B_WL. When signal B_INPUT is de-activated (e.g., high) it turns off transistor BP and turns on transistor BN, and as a result, turns off B_DRIVER by allowing current flowing from port B_WL through transistor BN to ground.

When driver A_DRIVER is on it activates port A_WL, and when it is off, it de-activates port A_WL. When driver B_DRIVER is on it activates port B_WL, and when it is off, it de-activates port B_WL. A_DRIVER and B_DRIVER may be referred to as a buffer that drive ports A_WL and B_WL respectively because they enable load increase for these ports. Drivers A_DRIVER and B_DRIVER also control suppress devices N4 and N3 respectively. As A_DRIVER is on it turns on B-port suppress device N4 and as B_DRIVER is on it turns on A-port suppress device N3.

Ports A_WL controls B-port suppress device N4 while port B_WL controls A-port suppress device N3. When port A_WL is activated (e.g., high), it turns on B-port suppress device N4, but when port A_WL is de-activated (e.g., low), it turns off B-port suppress device N4. Similarly, when port B_WL is activated (e.g., high), it turns on A-port suppress device N3, but when port B_WL is de-activated (e.g., low), it turns off A-port suppress device N3.

Nodes BL_IN and BLB_IN store the data for DPSRAM 100. Transistors N5-N8 and inverters INV1 and INV2 may be referred to as the bit cell of DPSRAM 100 because transistors N5-N8 with appropriate signals allow writing to and reading from nodes BL_IN and BLB_IN. Generally, the data stored at nodes BL_IN and BLB_IN are complement to each other. For example, if node BL_IN stores a low then node BL_IN stores a high, and if node BL_IN stores a high, then node BLB_IN stores a low, etc. To write to or read from DPSRAM 100, one of port A_WL or port B_WL is activated. Because DPSRAM 100 includes two-port word lines (e.g., ports A_WL, B_WL), DPSRAM 100 allows simultaneous reading via these two-ports.

To write to DPSRAM 100 corresponding signals and transistors N5-N8 may be selected and activated. For example, to write to node BL_IN using port A_WL port A_WL and transistor N5 are activated (e.g., high) and the data is inserted at signal A_BL. That is, to write a high, a high is inserted at signal A_BL, and to write a low, a low is inserted at signal A_BL. To read the data from node BL_IN, transistor N5 is activated. If this node BL_IN stores a high then the level at node BL_IN discharges, allowing detection of the voltage level difference between node BL_IN and node BLB_IN or a high. If node BL_IN stores a low then the voltage level does not discharge, allowing detection of a low.

To write to node BL_IN using port B_WL port B_WL and transistor N7 are activated (e.g., high) and the data is inserted at signal B_BL. That is, to write a high, a high is inserted at signal B_BL, and to write a low, a low is inserted at signal B_BL. To read the data from node BL_IN, transistor N7 is activated. If this node BL_IN stores a high then the voltage level at node BL_IN discharges, allowing detection of the voltage level difference between node BL_IN and node BLB_IN or a high. If node BL_IN stores a low then the voltage level does not discharge, allowing detection of a low.

Similarly, to write to node BLB_IN using port A_WL port A_WL and transistor N6 are activated (e.g., high) and the data is inserted at signal A_BLB. That is, to write a high, a high is inserted at signal A_BLB, and to write a low, a low is inserted at signal A_BLB. To read the data from node BLB_IN, transistor N6 is activated. If this node BLB_IN stores a high then the voltage level at node BLB_IN discharges, allowing detection of the voltage level difference between node BL_IN and node BLB_IN or a high. If node BLB_IN stores a low then the voltage level does not discharge, allowing detection of a low.

To write to node BLB_IN using port B_WL port B_WL and transistor N8 are activated (e.g., high) and the data is inserted at signal B_BLB. That is, to write a high, a high is inserted at signal B_BLB, and to write a low, a low is inserted at signal B_BLB. To read the data from node BLB_IN, transistor N8 is activated. If this node BLB_IN stores a high then the voltage level at node BLB_IN discharges, allowing detection of the voltage level difference between node BL_IN and node BLB_IN or a high. If node BLB_IN stores a low then the voltage level does not discharge, allowing detection of a low.

Voltage Level Compensation

Embodiments of the invention use A-port suppress device (e.g., transistor) N3 and B-port suppress device (e.g., transistor) N4 to control the voltage level of ports A_WL and B_WL, which in turns affects the voltage level at node BL_IN and BLB_IN. Node BL_IN serves a part of a voltage divider for the voltage level of ports A_WL and B_WL and between a first resistive device comprising transistors N5 and N7 in parallel and a second resistive device N1. Similarly, node BLB_IN serves as part of a voltage divider for the voltage level of ports A_WL and B_WL and between a first resistive device comprising transistors N6 and N8 in parallel and a second resistive device N2.

For illustration purposes, let node BL_IN stores a low and an attempt to read this low by using port A_WL and port B_WL simultaneously. At that time, both ports A_WL and B_WL and thus transistors N5 and N7 are active (e.g., high). Current thus flows from port A_WL through transistor N5 and from port B_WL through transistor N7 to transistor N1 and ground. Node BL_IN then sees both transistors N5 and N7 in parallel as a first resistive device and transistor N1 as a second resistive device, and node BL_IN thus serves as part of a voltage divider for these resistive devices. As a result, the low voltage level at node BL_IN is not a "pure" low (e.g., ground), but is raised by a voltage, e.g., Vraised, which, in an embodiment is about 0.18V. Without the compensation mechanism of the disclosure, this voltage Vraised can cause a misread at node BL_IN (e.g., reading a high instead of a low).

In various embodiments of the disclosure, suppress devices N3 and N4 compensate for or suppress the raised voltage level Vraised by lowering the voltage level at both ports A_WL and B_WL. Because port B_WL is on, it turns on suppress device N3. At this time, port A_WL serves as part of a voltage divider for the voltage source Vdd at transistor AP and between a first resistive transistor AP and a second resistive transistor N3. As a result, port A_WL is lowered by an amount, e.g., VloweredA, and thus from Vdd to Vdd-VloweredA. Similarly, because port A_WL is on, it turns on suppress device N4. At this time, port B_WL serves as part of a voltage divider for the voltage source Vdd at transistor BP and between a first resistive transistor BP and a second resistive transistor N4. As a result, port B_WL is lowered, e.g., by an amount VloweredB, and thus from Vdd to Vdd-VloweredB. In an embodiment, VloweredA and VloweredB are about the same of 10% of Vdd or 0.1V. Lowering the voltage level at ports A_WL and B_WL causes the voltage level at node BL_IN to be lowered, e.g., by VloweredBLIN. This is because, as explained above, node BL_IN serves as part of a voltage divider for the voltage level at ports A_WL and B_WL and between a first resistive device comprising N5 and N7 in parallel and a second resistive device N1. Because the voltage level at ports A_WL and B_WL is lowered, the voltage level at node BL_IN is also lowered. Node BL_IN is therefore at Vraised-VloweredB-LIN. Because the voltage level at node BL_IN is lowered, the noise margin at node BL_IN is improved, and misread can be avoided. In an embodiment VloweredBLIN is about 0.03V.

If node BL_IN stores a high, then, by general operation of DPSRAM 100, node BLB_IN stores a low, and embodiments of the invention are applicable to lower the voltage level of ports A_WL and B_WL and thus node BLB_IN when a low is read at node BLB_IN by both ports A_WL and B_WL at the same time, similar to the situation at node BL_IN as explained above. As a result, the noise margin at node BLB_IN is improved and misreads at node BLB_IN can be avoided.

Figure 2A:
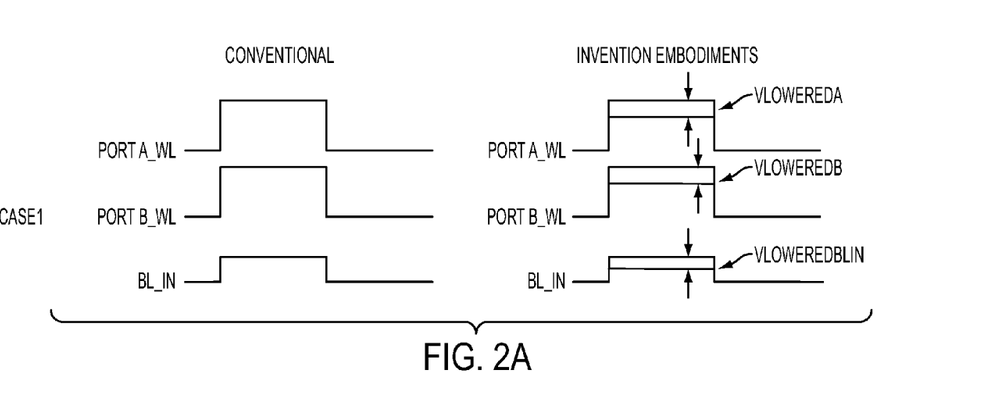
FIG. 2 shows illustrative signals related to the embodiment of FIG. 1.
Figure 2B:
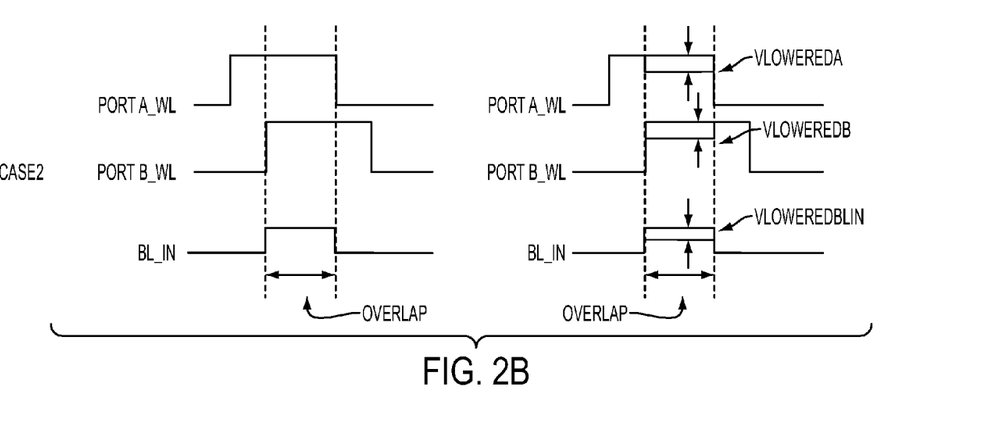

Various embodiments of the disclosure are advantageous when both ports A_WL and B_WL are active at the same time, e.g., when they are activated at the same time and/or overlap. Generally, ports A_WL and B_WL are active at the same time when signals A_INPUT and B_INPUT arrive at the same time. FIG. 2 shows illustrative signals related to ports A_WL and B_WL and node BL_IN. Signals on column "Conventional" show signals of other approaches while signals on column "Invention Embodiments" show signals in various embodiments of the invention. As explained above, in various embodiments of the invention suppress devices N3 and N4 lower the voltage level of ports A_WL and B_WL and thus the voltage level of node BL_IN when reading occurs simultaneously (e.g., both ports A_WL and B_WL are active at the same time).

In case 1 when ports A_WL and B_WL are activated (e.g., high) and thus active at the same time, the ports in other approaches operate normally. That is, the voltage level at both ports A_WL ad B_WL remains high (e.g., Vdd). In embodiments of the disclosure, however, the voltage level of ports A_WL and B_WL is pulled down (e.g., dropped) by VloweredA and VloweredB. Further, the voltage level of node BL_IN also drops by VloweredBLIN.

In case 2 when ports A_WL and B_WL are activated at different times, there is no change in other approaches. That is, their voltage level remains high. In embodiments of the disclosure, however, the voltage level of ports A_WL and B_WL also drops by VloweredA and VloweredB when ports A_WL and B_WL overlap. The voltage level of node BL_IN also drops by VloweredBLIN during this overlapped timing.

Depending on applications, ports A_WL and B_WL are separate and independent as they can run on two independent clocks (e.g., asynchronous). Because various embodiments of the disclosure are applicable when both ports A_WL and B_WL overlap including both being active at the same time (e.g., in cases 1 and 2 above), these ports may be referred to as synchronized to the same timing domain (e.g., the same timing with ports A_WL and B_WL).

Figure 3:
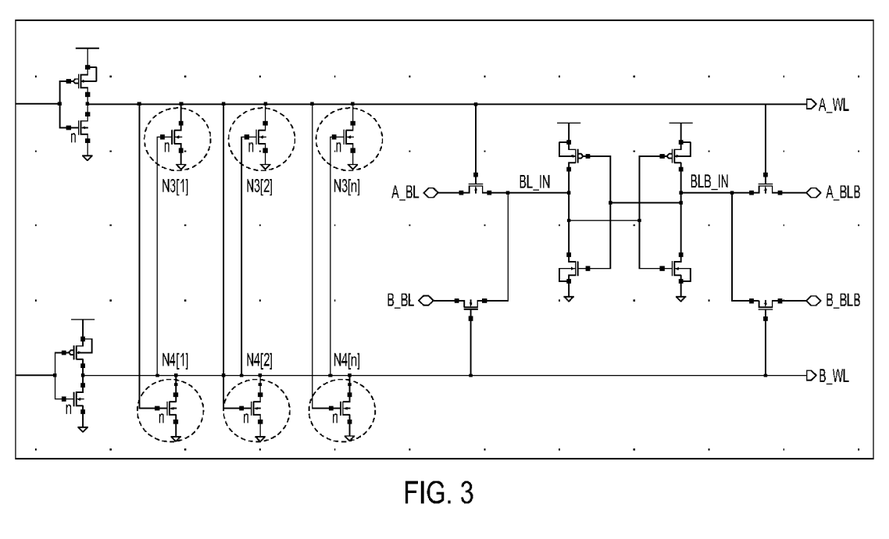
FIG. 3 shows illustrative suppress devices of the DPSRAM in FIG. 1 being connected in parallel.

In the above illustration, only one suppress device is shown for a port (e.g., transistor N3 for port A_WL, transistor N4 for port B_WL) for illustration only, but the invention is not limited to such a configuration. Additional suppress devices (e.g., N3, N4) may be added to corresponding ports (e.g., ports A_WL, B_WL) to achieve the desired level (e.g., VloweredA, VloweredB, VloweredBLIN) to be lowered. FIG. 3 shows an example of how suppress devices N3[1] to N3[$n$] and N4[1] to N4[$n$] may be connected in parallel in DPSRAM 100, in accordance with an embodiment of the invention. For simplicity, other elements of DPSRAM 100 are not labeled. Connecting suppress devices (e.g., N3, N4) in parallel allows additional voltage level to be lowered because the parallel suppress devices would be turned on at the same time. As a result, the equivalent resistor of these devices is smaller and leads to lower voltage level at the corresponding ports A_WL and B_WL.

Figure 4:
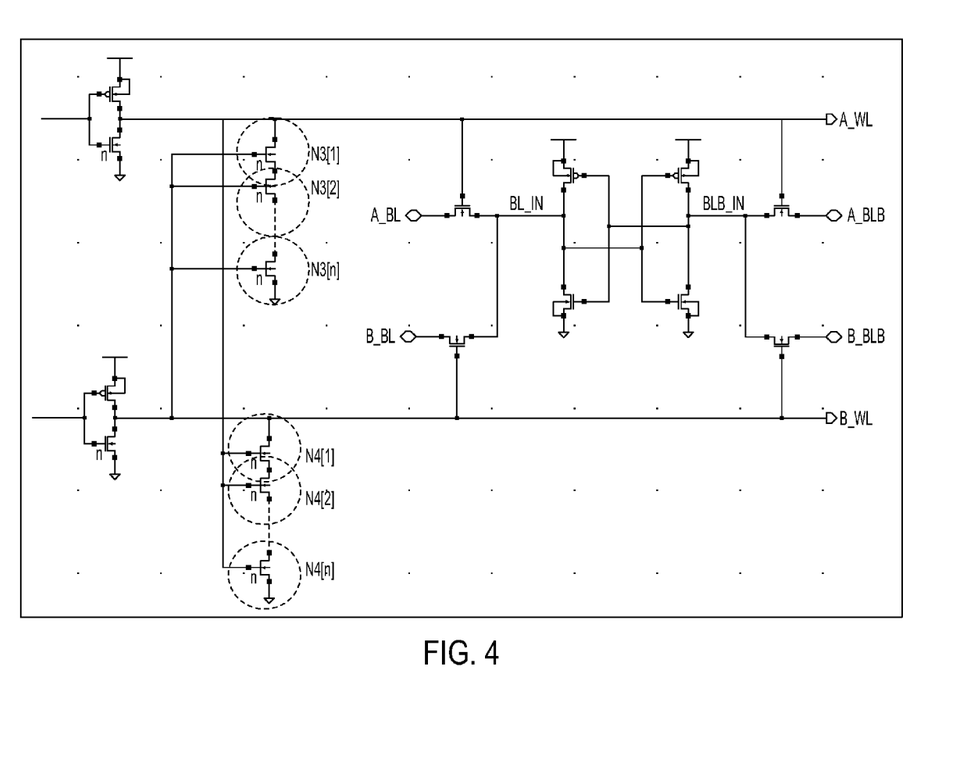
FIG. 4 shows illustrative suppress devices of the DPSRAM in FIG. 1 being connected in series.

FIG. 4 shows an example of how suppress devices N3[1] to N3[$n$] and N4[1] to N4[$n$] may be connected in series in DPSRAM 100, in accordance with an embodiment of the invention. Connecting the suppress devices in series allows less voltage level to be lowered because the equivalent resistor of these series devices is larger and leads to higher voltage level at the corresponding ports A_WL and B_WL. Depending on the design and actual level desired to be lowered a combination of parallel and/or series connection of suppress devices may be used.

Further, FIG. 1 shows two-port word lines (e.g., A_WL and B_WL) also for illustration only, embodiments of the disclosure are applicable in situations with various number of word line ports. For each word line port, embodiments include one or more suppress devices (e.g., one or more devices N3 for port A_WL and one or more devices N4 for port B_WL) to effect the voltage level of that port as desire consistent with the spirit and scope of embodiments of the disclosure as explained in this document.

Two-Port Register Files First Embodiment

Figure 5:
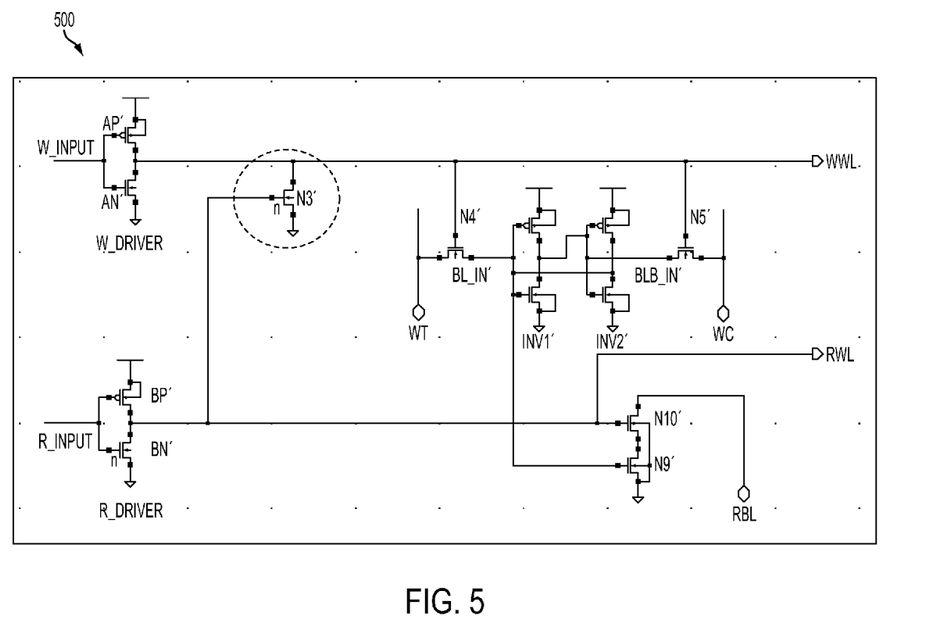
FIG. 5 shows a first exemplary 2PRF utilizing embodiments of the disclosure.

FIG. 5 shows a two-port register file 2PRF 500, in accordance with an embodiment. Inputs W_INPUT and R_INPUT correspond to inputs A_INPUT and B_INPUT of DPSRAM 100. Drivers W_DRIVER and R_DRIVER correspond to drivers A_DRIVER and B_DRIVER of DPSRAM 100. Driver R_DRIVER is associated with the read port and thus read operation of register file 2PRF 500. Signals WT and WC correspond to signals A_BL and A_BLB of DPSRAM 100, respectively. Write word line WWL corresponds to port A_WL of DPSRAM 100.

Transistors N4' and N5' and inverters INV1' and INV2' correspond to transistors N4 and N5 and inverters INV1 and INV2 of DPSRAM 100, and therefore may be referred to as the bit cell of two-port register file 500 because they allow writing to and reading from nodes BL_IN' and BLB_IN', which correspond to nodes BL_IN and BLB_IN of DPSRAM 100. Transistors N9' and N10' together with signals read word line RWL and read bit line RBL are generally used in read operations.

Some embodiments of the disclosure use write-port suppress device N3' to effect the voltage level of port WWL and therefore that of node BL_IN, similar to the situation of port A_WL and node BL_IN with respect to FIG. 1. Various embodiments of the invention are applicable when both signals WWL and RWL are active at the same time. That is reading and writing overlaps (e.g., active at the same time). The write operation of register file 2PRF 500 is similar to that of DPSRAM 100. That is, to write to nodes BL_IN' and BLB_IN', write word line WWL is activated, the data to be written is inserted at signal WT, and the complement data is inserted at signal WC. For example, if the data is high at signal WT and low at signal WC, then the written data is high and low at nodes BL_IN' and BLB_IN', respectively. If the data is low at signal WT and high at signal WC, then the written data is low and high at nodes BL_IN' and BLB_IN', respectively.

To read the data at node BL_IN', signal read word line RWL is activated, which turns on transistor N10'. If node BL_IN' stores a high, then this high level turns on transistor N9'. Because transistor N10' has been turned on by signal RWL, both transistors N9' and N10' are on, current then flows from node BL_IN' through transistors N9' and N10'. As a result, signal RBL discharges from a high (e.g., Vdd) toward a low (e.g., ground), and detecting this discharge by reading at signal RBL would reveal a high.

If node BL_IN' stores a low, then this low turns off transistor N9'. As a result, there is no current at signal RBL. Alternatively expressing, signal RBL is an open circuit, and reading at signal RBL would reveal a low. In many applications, however, the voltage level at node BL_IN' is not a pure low (e.g., ground), but is raised by some voltage, e.g., V'raised, which can slightly turn on transistor N9' and cause a misread (e.g., reading a high). Generally, node BLB_IN' is not involved in reading operation of 2PRF 500.

Write-port suppress device N3' when appropriate lowers the voltage level at port WWL by an amount of VloweredW, which in turns lowers the voltage level at node BL_IN' by an amount VloweredBLIN'. In an embodiment, VloweredW is about 0.1V, which is about 10% of Vdd. Various embodiments of the disclosure are advantageous when both ports WWL and RBL are active at the same time, e.g., when W_INPUT and R_INPUT arrive at the same time or overlap, which activate ports WWL and RWL at the same time.

When port WWL is activated, transistor AP' is on, and when port RWL is activated, transistor N3' is on. As a result, current flows from Vdd through transistor AP', port WWL, transistor N3' and ground. Port WWL thus serves as part of a voltage divider for Vdd and between the first resistive transistor AP' and a second resistive transistor N3'. Port WWL is therefore lowered by an amount VloweredW, e.g., from Vdd to Vdd-VloweredW.

As port WWL is activated, it turns on transistor N4'. As node BL_IN' stores a low, this low level turns on transistor N9'. As a result, current flows from port WWL through transistor N4', node BL_IN', transistor N9' and ground. Node BL_IN' thus serves as part of a voltage divider for port WWL and between a first resistive transistor N4' and a second resistive transistor N9'. As the voltage level at port WWL has been lowered (e.g., by VloweredW), the voltage level at node BL_IN' is also lowered, e.g., by VloweredBLIN'. Because the voltage level of BL_IN' is lowered, the noise margin at node BL_IN' is better. As a result, the lower level at node BL_IN' can reliably turn off transistor N9' and can prevent misreads.

Figure 6A:
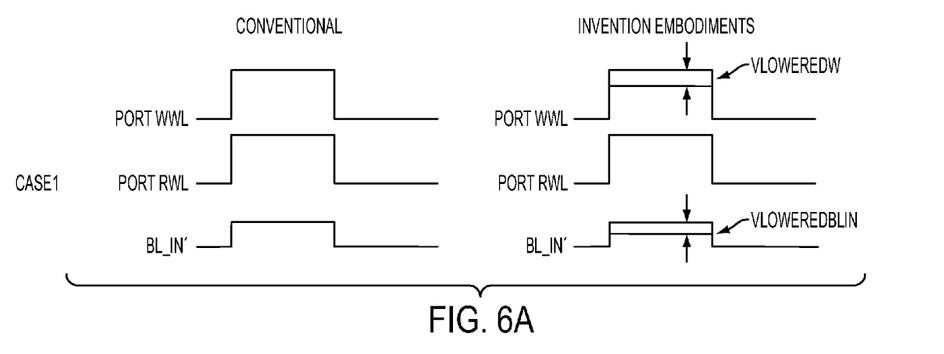
FIG. 6 shows illustrative signals related to the embodiment of FIG. 5.
Figure 6B:
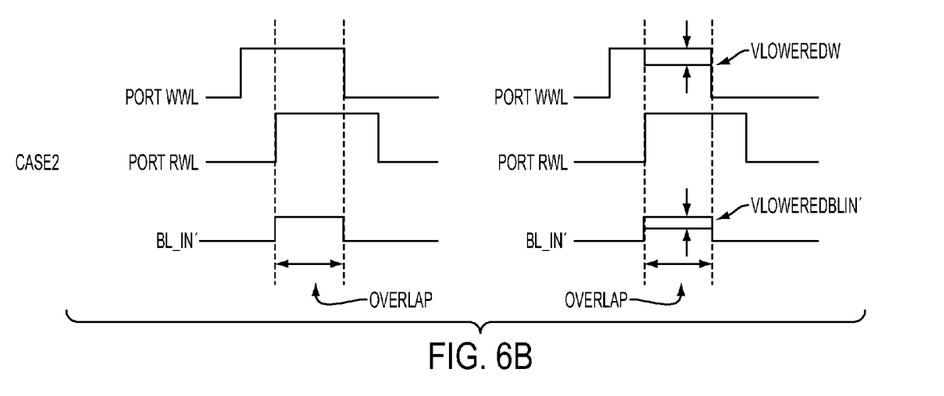

FIG. 6 shows illustration signals related ports WWL and RWL and node BL_IN'. Signals on column "Conventional" show signals of other approaches wherein signals on column "Disclosure Embodiments" show signals in various embodiments of the disclosure. As explained above, in various embodiments of the invention suppress device N3' lowers the voltage level of port WWL when writing and reading occur simultaneously (e.g., both ports WWL and RWL are active at the same time).

In case 1 when ports WWL and RWL are activated (e.g., high) and thus active at the same time, the ports in other approaches operate normally. That is, the voltage level at port WWL remains high (e.g., Vdd). In embodiments of the invention, however, the voltage level of port WWL drops by VloweredW, and the voltage level of node BL_IN' drops by VloweredBLIN'.

In case 2 when ports WWL and RWL are activated at different times, there is no change in other approaches. That is, their voltage level remains high. In embodiments of the disclosure, however, the voltage level of port WWL drops by VloweredW when ports WWL and RWL overlap (e.g., active at the same time). This feature of embodiments of the disclosure is applicable regardless of whether port WWL or RWL arrives first. The voltage level of node BL_IN' also drops by VloweredBLIN' during this overlapped timing.

FIG. 5 shows a 2PRF 500 having one write port WWL and one read port RWL with associated circuit for each port for illustration purposes only. Embodiments of the invention are not limited to such a configuration, but are applicable in situations with various numbers of write ports and read ports. For each additional write port, embodiments, for example, add a suppress device (e.g., similar to device N3') to lower the voltage level of that write port and thus node BL_IN' as appropriate. For each additional read port, embodiments add additional circuitry to work with suppress device N3' and that read port to lower the voltage level of the write port and thus node BL_IN' as appropriate.

Register File

Additional Write Port

Figure 7:
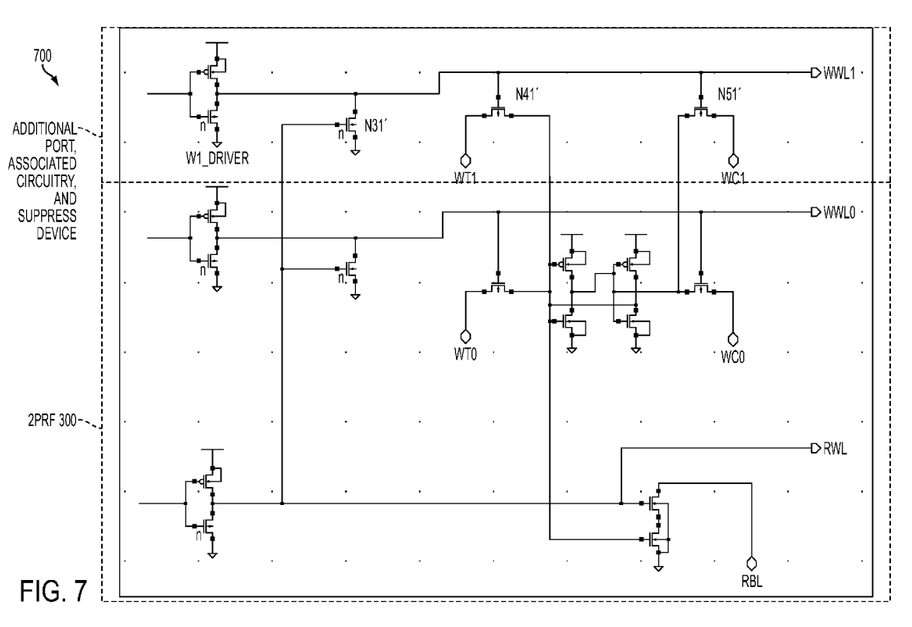
FIG. 7 shows a second exemplary 2PRF utilizing embodiments of the disclosure.

Embodiments of the disclosure are applicable to register files having more than one write port. FIG. 7 shows an illustrative register file 700 having a write port added to two-port register file 2PRF 500, in accordance with an embodiment of the invention. For simplicity, components of register file 2PRF 500 are not labeled. In this example, port WWL of 2PRF 500 has been renamed to WWL0, and additional write port WWL1 with driver W1_DRIVER, transistors N41' and N51', and an additional suppress device N31' are added. Port WWL1, W1_DRIVER, transistors N41' and N51', and suppress device N31' correspond to port WWL, W_DRIVER, transistors N4 and N5, and suppress device N3 of register file 2PRL 500, respectively. The operation of these added components are similar to that of the corresponding components of register file 2PRF 500 as explained above with respect to FIG. 5. Those skilled in the art will recognize that, in this illustration, embodiments of the disclosure provide the level compensation (e.g., lower the voltage level at node BL_IN' and the corresponding write port) when either port WWL0 or port WWL1 and port RWL are activate at the same time, consistent with the spirit and scope of the invention as described in this document.

Register File

Additional Read Port

Figure 8:
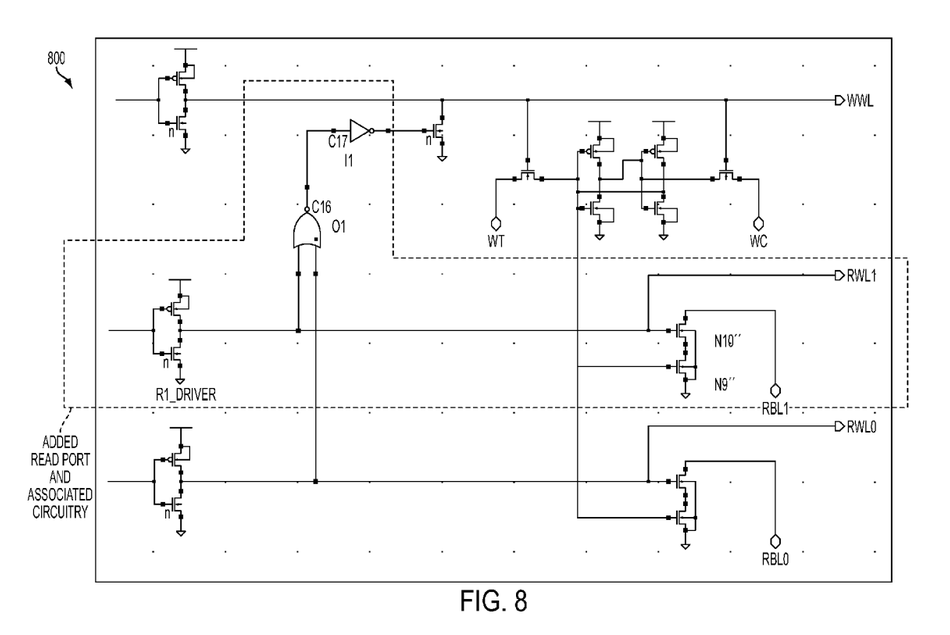
FIG. 8 shows a third exemplary 2PRF utilizing embodiments of the disclosure.

Embodiments of the disclosure are applicable in register files having more than one read port. FIG. 8 shows an illustrative register file 800 having a read port added to two-port register file 2PRF 500, in accordance with an embodiment of the disclosure. For simplicity, components of register file 2 PFR 500 are not labeled. In this example, read port word line RWL and signal read bit line RBL of 2PRF have been renamed to RWL0 and RBL0, and a read port word line RWL1 with associated circuitry has been added, which include read-port driver R1_Driver, transistors N9'' and N10'', and signal read bit line RBL1. OR gate O1 and inverter I1 have also been added. Driver R1_Driver, transistors N9'' and N10'', and signal RBL1 correspond to driver R_Driver, transistors N9' and N10', and signal RBL of register file 2PRF 500. OR gate O1 can select one or a combination of read ports RWL0 and RWL1 when one or a combination of these ports is active. Inverter I1 inverts the logic state of the output of OR gate O1 to acquire an appropriate state to drive suppress device N3'. As a result, when write port WWL and one or a combination of read ports RWL0 and RWL1 are activated, suppress device N3' lowers the voltage level of port WWL and thus node BL_IN' as explained above in connection with the example of FIG. 5. OR gate O1 and inverter I1 are shown for illustration only, various other compatible circuits may be used to select one or a combination of ports RWL0 and RWL1. Further, additional read port(s) similar to port RWL1 with associated circuitry may be added and thus benefit from embodiments of the invention consistent with the spirit and scope described herein. Additionally, similar to the embodiment of DPSRAM 100, various suppress devices may be connected in parallel, series, or a combination thereof to achieve the desired voltage level to be lowered.

A number of embodiments have been described. It will nevertheless be understood that various variations and/or modifications may be made without departing from the spirit and scope of the invention. For example some transistors are shown to be N-type and some others are shown to be P-type, but the disclosure is not limited to such a configuration because selecting a transistor type (e.g., NMOS or PMOS) is a matter of design choice based on need, convenience, etc. Embodiments of the disclosure are applicable in all variations and/or combinations of transistor types. For further examples, various suppress devices are shown to be NMOS (e.g., N3, N4, N3', etc.) to work with exemplary configurations of DPSRAM 100 and register file 2PRF 500 having PMOS transistors AP BP, NMOS transistors AN, BN, N5-N8, etc. But if these PMOS transistors are changed to NMOS transistors, and NMOS transistors are selected as PMOS transistors, those suppress devices may be changed to PMOS devices to operate accordingly. The above illustration shows suppress devices lowing the voltage level of ports (e.g., A_WL, B_WL, WWL, etc.) and corresponding nodes (e.g., BL_IN, BL_IN', etc.), but embodiments are applicable when raising the voltage levels as appropriate (e.g., when the device operates in the negative operation voltage). Additionally, some signals are illustrated with a particular logic level to operate some transistors (e.g., activated high, deactivated low, etc.), but selecting such levels and transistors are also a matter of design choice, and embodiments are applicable in various design choices to maintain the spirit and scope of the invention as explained herein.

Each claim of this document constitutes a separate embodiment, and embodiments that combine different claims and/or different embodiments are within scope of the invention and will be apparent to those skilled in the art after reviewing this disclosure.

What is claimed is:

1. A circuit comprising:
a memory cell;
a first word line associated with the memory cell;
a first device coupled to the first word line; and
a second word line associated with the memory cell and configured to control the first device,
wherein the first device is adapted to change the voltage level of the first word line and of a node of the memory cell when the first word line and the second word line are active at the same time.

2. The circuit of claim 1, wherein the memory cell is a dual port SRAM cell.

3. The circuit of claim 1, wherein the first device is configured to serve as a resistive component for a voltage divider that includes a voltage source and the voltage level of the first word line.

4. The circuit of claim 1, further comprising a second device coupled to the first device and configured to serve as a resistive component for a voltage divider that includes a voltage source and the voltage level of the first word line.

5. The circuit of claim 1, further comprising a second device coupled to the second word line and adapted to change a voltage level of the second word line and of the node, wherein the first word line is configured to control the second device.

6. The circuit of claim 1, wherein the first word line and the second word line are a read word line and a write word line of a register file; and the node stores data for the register file.

7. The circuit of claim 1, further comprising a second device, wherein the second device in conjunction with the first device is adapted to change the voltage level of the first word line and of the node.

8. The circuit of claim 7, wherein the second device is coupled to the first device in parallel or in series.

9. The circuit of claim 1, further comprising at least a third word line and at least a corresponding second device that is adapted to change a voltage level of the at least third word line and the voltage level of the node.

10. The circuit of claim 1, further comprising a third word line,
wherein a combination of the second word line and the third word line is configured to control the first device.

11. A circuit comprising:
a voltage source;
a memory cell;
a first word line associated with the memory cell;
a first device configured to act as a resistive component for a first voltage divider that includes the voltage source and the first word line;
a second word line associated with the memory cell and electrically connected to the first device; and
a node storing data for the memory cell;
wherein the first device is adapted to change a voltage level of the first word line and of the node when the first word line and the second word line are active.

12. The circuit of claim 11, further comprising a second device coupled in parallel or in series with the first device; the second device adapted to further change the voltage level of the first word line and of the node.

13. The circuit of claim 11, wherein the memory cell is a dual port SRAM cell or a register file bit cell.

14. The circuit of claim 11, wherein the second word line is configured to control the first device.

15. The circuit of claim 14, further comprising a second device adapted to change a voltage level of the second word line and the voltage level of the node; the first word line is configured to control the second device.

16. The circuit of claim 11, further comprising at least a third word line and at least a corresponding second device that is adapted to change a voltage level of the at least third word line and the voltage level of the node.

17. The circuit of claim 11, further comprising third word line, wherein a combination of the second word line and the third word line are configured to control the first device.

18. A circuit comprising:
a memory cell having a node configured to store data;
a first transistor of a predetermined type having a gate terminal and being configured to transfer data for the node responsive to a signal at the gate terminal of the first transistor;
a first port coupled to the gate terminal of the first transistor;
a second transistor of the predetermined type having a gate terminal and being configured to transfer data for the node responsive to a signal at the gate terminal of the second transistor;
a second port coupled to the gate terminal of the second transistor;
a third transistor of the predetermined type having a gate terminal coupled to the second port, a drain terminal coupled to the first port, and a source terminal coupled to a reference voltage node.

19. The circuit of claim 18, further comprising:
a fourth transistor of the predetermined type having a gate terminal coupled to the first port, a drain terminal coupled to the second port, and a source terminal coupled to the reference voltage node.

20. The circuit of claim 18, further comprising:
a third port; and
a fourth transistor of the predetermined type having a gate terminal coupled to the second port, a drain terminal coupled to the third port, and a source terminal coupled to the reference voltage node.

* * * * *